(12) United States Patent
Ma

(10) Patent No.: US 11,342,425 B2
(45) Date of Patent: May 24, 2022

(54) SEMICONDUCTOR DEVICE HAVING NEEDLE-SHAPE FIELD PLATE TRENCHES AND NEEDLE-SHAPED GATE TRENCHES

(71) Applicant: Infineon Technologies Austria AG, Villach (AT)

(72) Inventor: Ling Ma, Redondo Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/029,519

(22) Filed: Sep. 23, 2020

(65) Prior Publication Data

US 2022/0093753 A1   Mar. 24, 2022

(51) Int. Cl.
*H01L 29/40* (2006.01)
*H01L 29/423* (2006.01)
*H01L 23/522* (2006.01)
*H01L 29/10* (2006.01)

(52) U.S. Cl.
CPC ........ *H01L 29/407* (2013.01); *H01L 23/5226* (2013.01); *H01L 29/1095* (2013.01); *H01L 29/401* (2013.01); *H01L 29/4236* (2013.01)

(58) Field of Classification Search
CPC ............... H01L 29/407; H01L 29/4236; H01L 23/5226
See application file for complete search history.

(56) References Cited

U.S. PATENT DOCUMENTS

2016/0181417 A1* 6/2016 Kampen ............... H01L 29/407
257/331
2016/0293751 A1* 10/2016 Siemieniec ......... H01L 29/7813

\* cited by examiner

*Primary Examiner* — Joseph C. Nicely
(74) *Attorney, Agent, or Firm* — Murphy, Bilak & Homiller, PLLC

(57) ABSTRACT

A semiconductor device includes: a semiconductor substrate; a plurality of needle-shaped field plate trenches and a plurality of needle-shaped gate trenches formed in the semiconductor substrate and interspersed with one another; a first dielectric layer above the semiconductor substrate; a gate interconnect structure including electrically conductive lines separated from the semiconductor substrate by the first dielectric layer and first conductive vias extending through the first dielectric layer to connect the electrically conductive lines to gate electrodes in the needle-shaped gate trenches; and a field plate interconnect structure electrically isolated from the gate interconnect structure and including second conductive vias that extend through the first dielectric layer and connect to field plates in the needle-shaped field plate trenches.

20 Claims, 16 Drawing Sheets

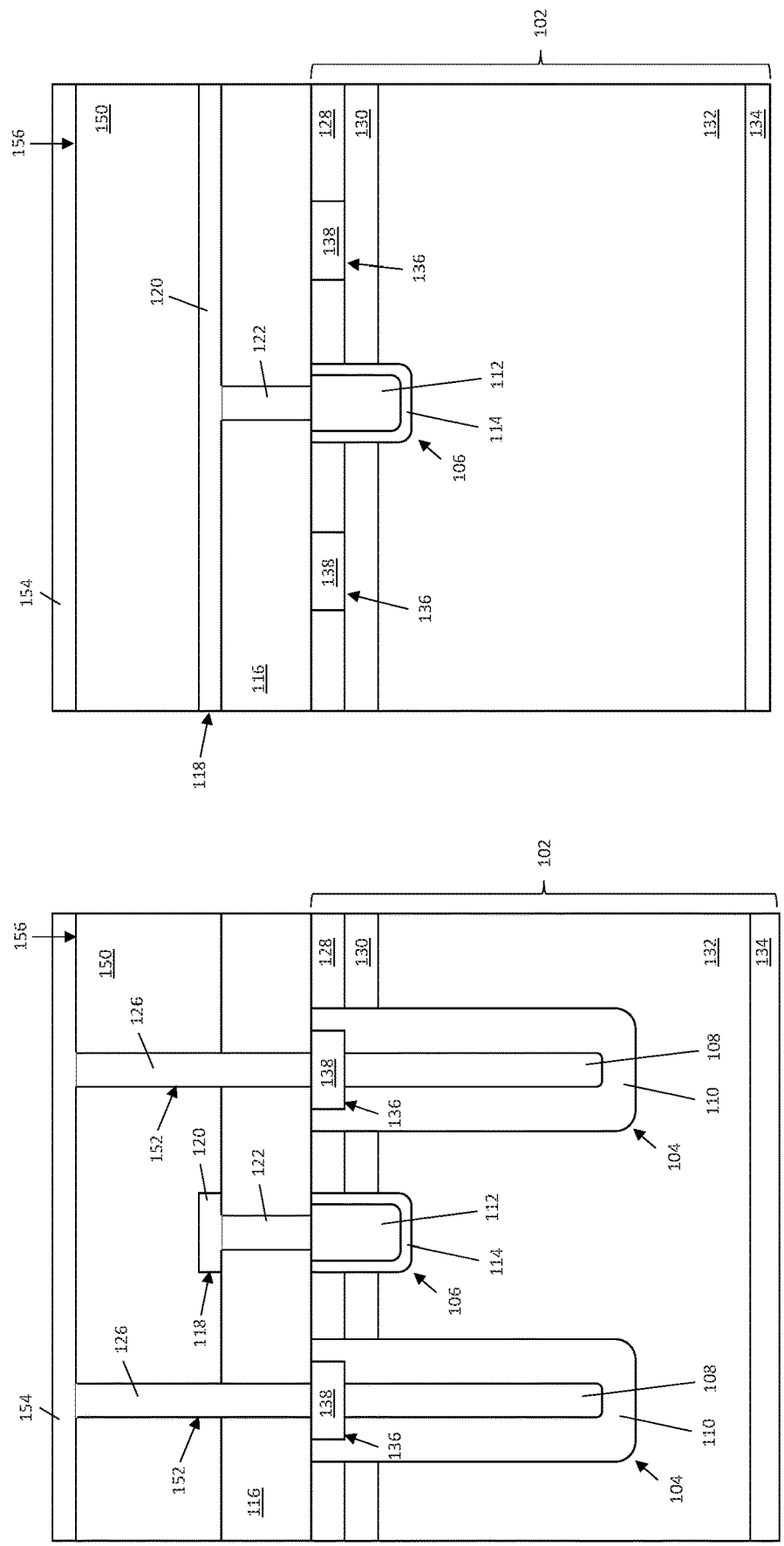

SEMICONDUCTOR DEVICE HAVING NEEDLE-SHAPE FIELD PLATE TRENCHES AND NEEDLE-SHAPED GATE TRENCHES

BACKGROUND

To further improve the performance of field-effect transistors (FETs) for power electronic applications, needle field plate structures have been introduced. Needle field plate structures are implemented as needle-shaped field plates formed in needle-shaped trenches. Needle field plate structures provide very low gate-drain charge (Qgd) and improve device FOM (figure of merit). However, the needle field plate configuration forces stripe-shaped or grid-pattern gate trenches to be placed between the needle field plate trenches since the top of the needle field plate structures are connected to source potential. Such a configuration impedes further pitch reduction and therefore limits $R_{DSon}$ performance, where $R_{DSon}$ is the total resistance between the drain and source in a metal-oxide-semiconductor needle FET (MOSFET) when the needle MOSFET is on.

The limitation on pitch reduction has been addressed by increasing alignment accuracy, increasing photo tool resolution, and reducing the critical dimension of stripe-shaped or grid-pattern gate trenches which calls for use of metallic gate electrodes processes due to the resulting higher gate resistance Rg. Each of these options increases process complexity and cost.

Thus, there is a need for an improved needle FET structure that can be produced with lower complexity and lower cost.

SUMMARY

According to an embodiment of a semiconductor device, the semiconductor device comprises: a semiconductor substrate; a plurality of needle-shaped field plate trenches and a plurality of needle-shaped gate trenches formed in the semiconductor substrate and interspersed with one another; a first dielectric layer above the semiconductor substrate; a gate interconnect structure comprising electrically conductive lines separated from the semiconductor substrate by the first dielectric layer and first conductive vias extending through the first dielectric layer to connect the electrically conductive lines to gate electrodes in the needle-shaped gate trenches; and a field plate interconnect structure electrically isolated from the gate interconnect structure and comprising second conductive vias that extend through the first dielectric layer and connect to field plates in the needle-shaped field plate trenches.

According to an embodiment of a method of producing a semiconductor device, the method comprises: forming a plurality of needle-shaped field plate trenches and a plurality of needle-shaped gate trenches in a semiconductor substrate and interspersed with one another; forming a first dielectric layer above the semiconductor substrate; forming a gate interconnect structure comprising electrically conductive lines separated from the semiconductor substrate by the first dielectric layer and first conductive vias extending through the first dielectric layer to connect the electrically conductive lines to gate electrodes in the needle-shaped gate trenches; and forming a field plate interconnect structure electrically isolated from the gate interconnect structure and comprising second conductive vias that extend through the first dielectric layer and connect to field plates in the needle-shaped field plate trenches.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 8C illustrate different partial cross-sectional views of the semiconductor transistor device during different stages of production.

DETAILED DESCRIPTION

The embodiments described provide replace stripe-shaped or grid-pattern gate trenches with needle-shaped gate trenches, and interconnect individual gate electrodes in the needle-shaped gate trenches with a metal runner network formed within an interlayer dielectric (ILD) layer in a third (vertical) dimension, allowing for scaling down to lower voltage nodes. In addition, the body contact configuration described herein allows for closer placement of needle-shaped field plate trenches, yielding a denser layout without resorting to extremely high resolution and alignment accuracy tools. Related methods of producing such a transistor device are also described.

Figure 1:
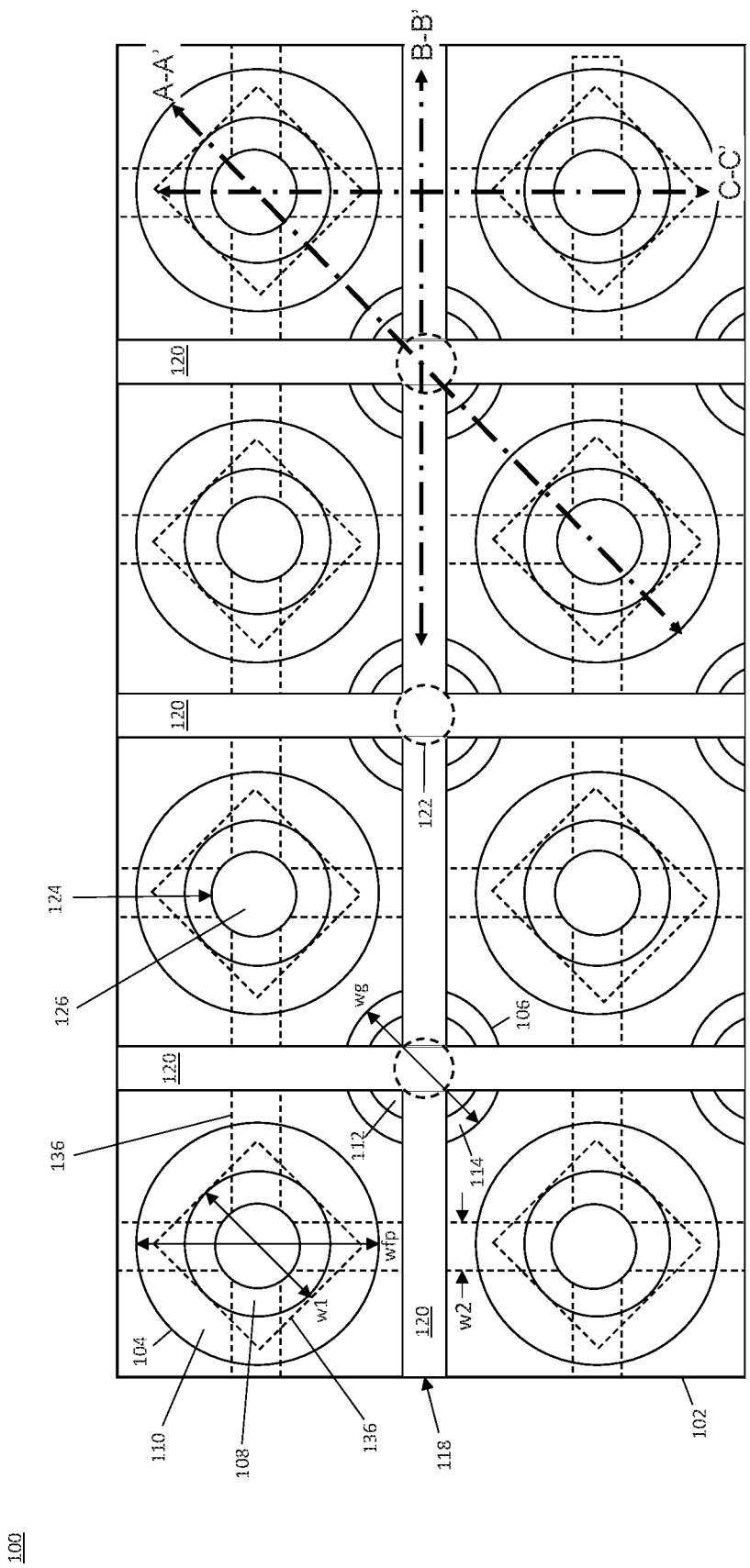
FIG. 1 illustrates a partial top plan view of an embodiment of a semiconductor transistor device having a needle gate trench configuration and a needle field plate trench configuration.

FIG. 1 illustrates a partial top plan view of a semiconductor transistor device 100 having a needle gate trench configuration and a needle field plate trench configuration. The semiconductor transistor device 100 includes a semiconductor substrate 102. The semiconductor substrate 102 may include one or more of a variety of semiconductor materials that are used to form semiconductor devices such as power MOSFETs, IGBTs (insulated gate bipolar transistors), HEMTs (high-electron mobility transistors), etc. For example, the semiconductor substrate 102 may include silicon (Si), silicon carbide (SiC), germanium (Ge), silicon germanium (SiGe), gallium nitride (GaN), gallium arsenide (GaAs), and the like. The semiconductor substrate 102 may be a bulk semiconductor material or may include one or more epitaxial layers grown on a bulk semiconductor material. In one embodiment, the semiconductor transistor device 100 is a depletion mode device with aggressive feature size reductions.

The semiconductor transistor device 100 further includes needle-shaped field plate trenches 104 and needle-shaped gate trenches 106 formed in the semiconductor substrate 102 and interspersed with one another. The term 'needle-shaped' as used herein means a trench structure that is narrow and long in a depth-wise direction (into the page of FIG. 1) of the semiconductor substrate 102. For example, the needle-shaped field plate trenches 104 and the needle-shaped gate trenches 106 may each resemble a needle, column or spicule in the depth-wise direction of the semiconductor substrate 102.

The needle-shaped field plate trenches 104 may be placed very close to one another, e.g., as close as needed to scale down the voltage nodes and as close as device optimization requires. The needle-shaped gate trenches 106 may be formed in any available semiconductor material between the needle-shaped field plate trenches 104.

In one embodiment, the needle-shaped field plate trenches 104 are arranged in an orthogonal array in that from a top plan view, the needle-shaped field plate trenches 104 lie at right angles with respect to one another, e.g., as shown in FIG. 1. However, the needle-shaped field plate trenches 104 may be arranged in other configurations, e.g., as described later herein.

A field plate 108 is disposed in each needle-shaped field plate trench 104 and separated from the surrounding semiconductor substrate 102 by a field dielectric 110. In a similar manner, a gate electrode 112 is disposed in each needle-shaped gate trench 106 and separated from the surrounding semiconductor substrate 102 by a gate dielectric 114. The needle-shaped field plate trenches 104 and the needle-shaped gate trenches 106 may have different dimensions. For example, the needle-shaped field plate trenches 104 may be wider than the needle-shaped gate trenches 106 (wfp>wg). The needle-shaped field plate trenches 104 may extend deeper into the semiconductor substrate 102 than the needle-shaped gate trenches 106. The field plates 108 and the gate electrodes 112 may be made from any suitable electrically conductive material such as polysilicon, metal, metal alloy, etc. The field plates 108 and the gate electrodes 112 may comprise the same or different electrically conductive material. The field dielectric 110 and the gate dielectric 114 may comprise the same or different electrically insulative material, e.g., SiOx and may be formed by one or more common processes such as thermal oxidation and/or deposition.

The semiconductor transistor device 100 also includes a first dielectric layer 116 above the semiconductor substrate 102. The first dielectric layer 116 is omitted from FIG. 1 to provide an unobstructed view of the underlying features, but is shown in subsequent figures. In one embodiment, the first dielectric layer 116 is an interlayer dielectric (ILD) such as SiOx, SiN, etc.

The semiconductor transistor device 100 also includes a gate interconnect structure 118 that interconnects the individual gate electrodes 112 in the needle-shaped gate trenches 106. The gate interconnect structure 118 includes electrically conductive lines 120 separated from the semiconductor substrate 102 by the first dielectric layer 116 and conductive vias 122 extending through the first dielectric layer 116. The conductive vias 122 connect the overlying electrically conductive lines 120 to the gate electrodes 112 in the underlying needle-shaped gate trenches 106. In one embodiment, the electrically conductive lines 120 and the conductive vias 122 of the gate interconnect structure 118 are formed within the first dielectric layer 116, allowing for scaling down to lower voltage nodes. In one embodiment, the electrically conductive lines 120 and the conductive vias 122 of the gate interconnect structure 118 are made of W (tungsten) with a Ti (titanium)/TiN (titanium nitride) liner. In general, any type of metal, metal alloy, or metal silicide may be used to form the electrically conductive lines 120 and the conductive vias 122 of the gate interconnect structure 118. In one embodiment, the electrically conductive lines 120 of the gate interconnect structure 118 intersect one another at right angles, as shown in FIG. 1.

The semiconductor transistor device 100 also include a field plate interconnect structure 124 electrically isolated from the gate interconnect structure 118. Accordingly, the field plate interconnect structure 124 and the gate interconnect structure 118 may be at different electric potentials. For example, the field plate interconnect structure 124 may be at source potential and the gate interconnect structure 118 may be at gate potential. The field plate interconnect structure 124 includes conductive vias 126 that extend through the first dielectric layer 116 and connect to the field plates 108 in the needle-shaped field plate trenches 104. In one embodiment, the field plate interconnect structure 124 is made of W with a Ti/TiN liner. In general, any type of metal, metal alloy, or metal silicide may be used to form the field plate interconnect structure 124.

Described next is an embodiment of a method of producing the semiconductor transistor device 100. FIGS. 2A through 8C illustrate different partial cross-sectional views of the semiconductor transistor device 100 during different stages of production. FIGS. 2A through 8A illustrate a partial cross-sectional view of the semiconductor transistor device 100 along the line labeled A-A' in FIG. 1, during different stages of production. FIGS. 2B through 8B illustrate a partial cross-sectional view of the semiconductor transistor device 100 along the line labeled B-B' in FIG. 1, during different stages of production. FIGS. 2C through 8C illustrate a partial cross-sectional view of the semiconductor transistor device 100 along the line labeled C-C' in FIG. 1, during different stages of production.

Figure 2B:
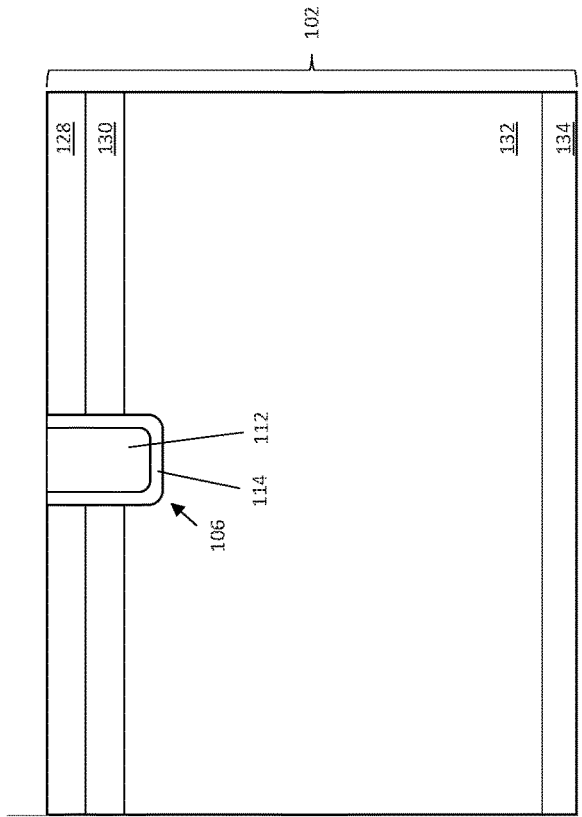
Figure 2A:
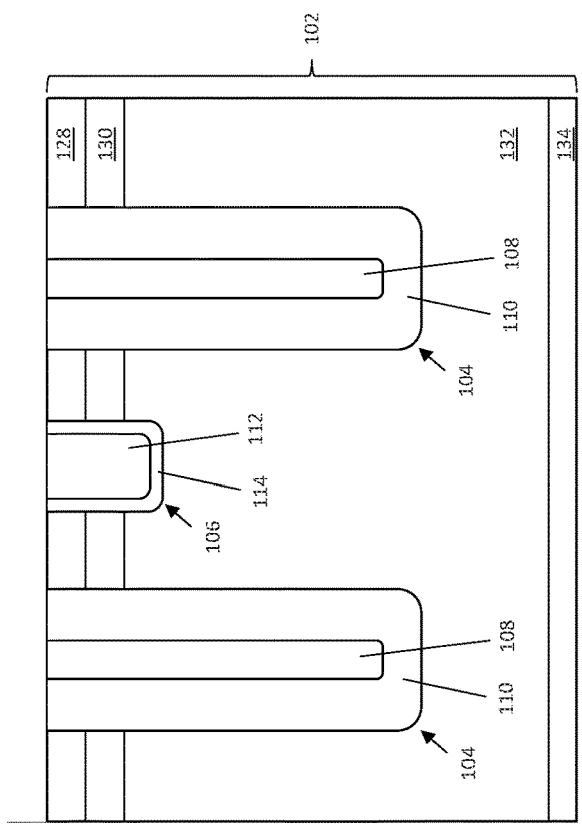
Figure 2C:
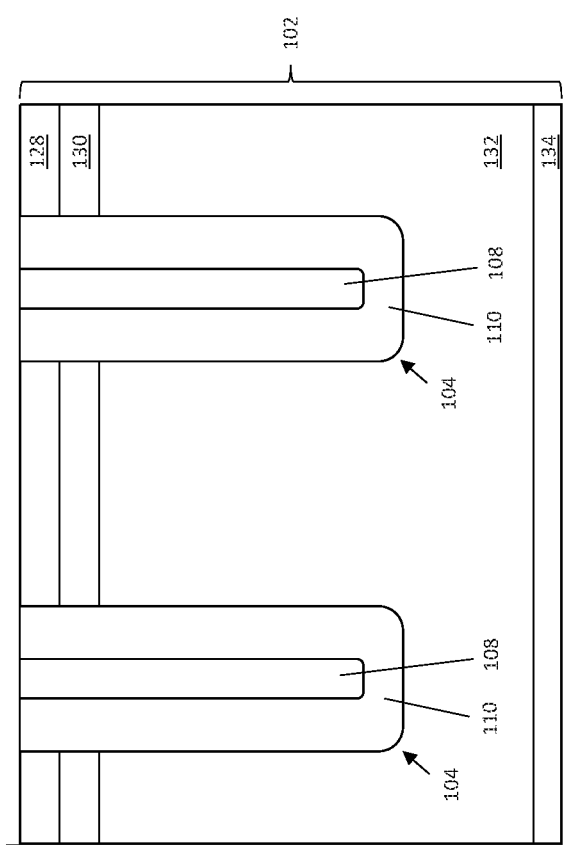

In FIGS. 2A through 2C, the needle-shaped field plate trenches 104 and the needle-shaped gate trenches 106 have been formed in the semiconductor substrate 102, as have source regions 128 of a first conductivity type and body regions 130 of a second conductivity type. The first conductivity type is n-type and the second conductivity type is p-type in the case of an n-channel device. In the case of a p-channel device, the first conductivity type is p-type and the second conductivity type is n-type.

The source regions 128 are formed in the semiconductor substrate 102 above the body regions 130. The source regions 128 and the body regions 130 may be formed by standard ion implantation and annealing processes.

A drift zone 132 of the first conductivity type is formed in the semiconductor substrate 102 below the body regions 130 such that the body regions 130 separate the source regions 128 from the drift zone 132. The needle-shaped field plate trenches 104 and the needle-shaped gate trenches 106 extend through the source regions 128 and the body regions 130 and into the drift zone 132. In the case of a vertical transistor, the semiconductor transistor device 100 may include a drain region 134 of the first conductivity type at the opposite side of the semiconductor substrate 102 as the source regions 128.

Figure 3B:
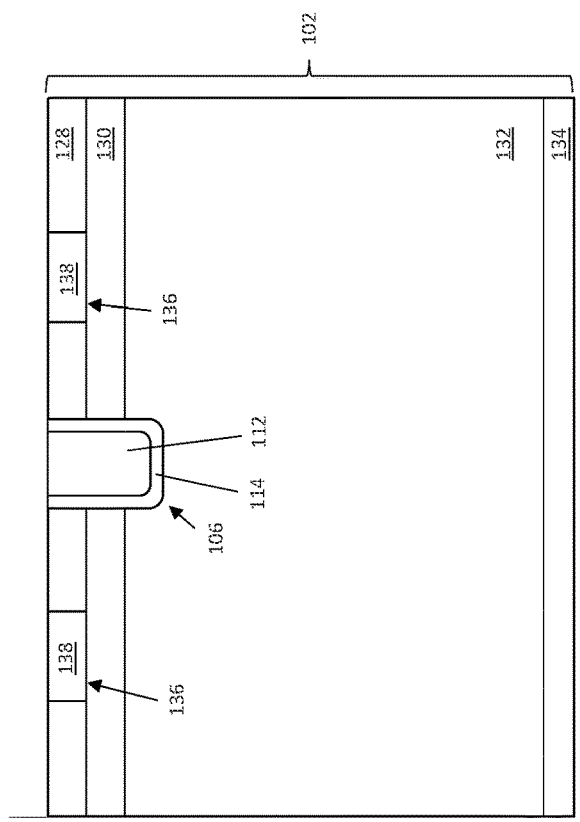
Figure 3A:
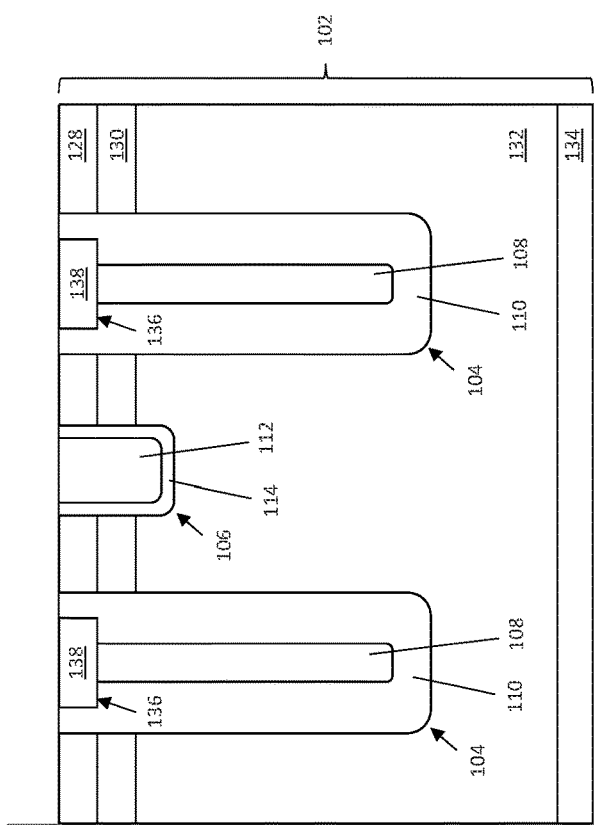
Figure 3C:
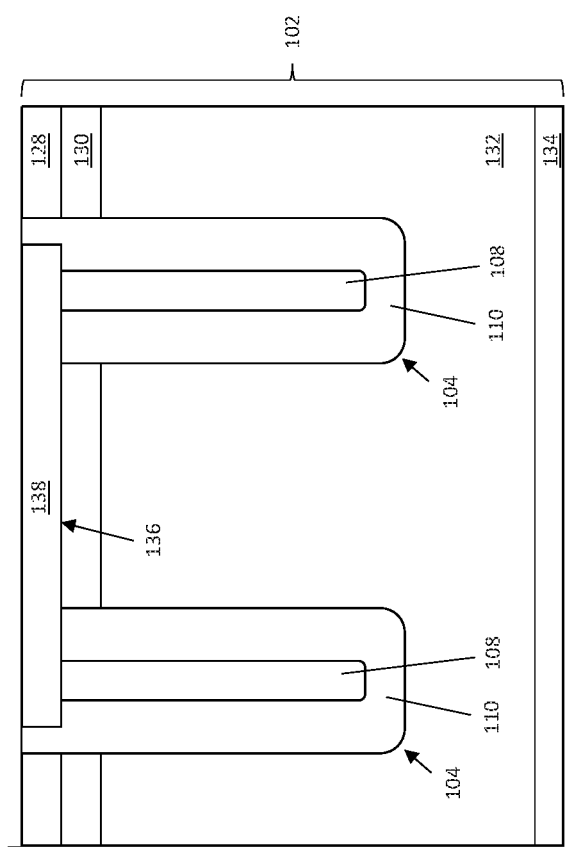

In FIGS. 3A through 3C, grooves 136 are formed in the semiconductor substrate 102. The grooves 136 intersect one another at the needle-shaped field plate trenches 104, as shown in FIG. 1. An electrically conductive material 138 in the grooves 136 electrically connects the field plates 108 to one another. The grooves 136 are illustrated with dashed lines in FIG. 1 and the electrically conductive material 138 in the grooves 136 is not shown in FIG. 1, to minimize obstruction of other device features.

As explained above, the filled grooves 136 directly connect the field plates 108 to one another. Accordingly, the field plate contact critical dimension and any critical alignment requirements for contacting the field plates 108 may be significantly reduced, allowing for very close placement of the needle-shaped field plate trenches 104. With respect to avalanche ruggedness of the semiconductor transistor device 100, the layout design for the shape of the grooves 136 may be adjusted accordingly, e.g., by adjusting the width of the grooves 136, to maintain a certain minimal distance to the needle-shaped gate trenches 106. An implant mask may be used to eliminate the source implants in regions of the semiconductor substrate 102 that do not aid in current conduction, to enhance ruggedness.

In one embodiment, the grooves 136 are etched into the semiconductor substrate 102 using a lithographic etch process that includes developing a resist mask and etching regions of the semiconductor substrate 102 unprotected by the mask. The grooves 136 may be etched into the semiconductor substrate 102 such that each of the needle-shaped field plate trenches 104 is intersected by more than one groove 136. In FIG. 1, e.g., each needle-shaped field plate trench 104 is intersected by two orthogonal grooves 136. The grooves 136 are then filled with the electrically conductive material to electrically connect the field plates 108 to one another. For example, the electrically conductive material 138 may be deposited over the semiconductor substrate 102 and then planarized, e.g., by CMP (chemical-mechanical polishing) to fill the grooves 136. The electrically conductive material 138 filling the grooves 136 may be a metal silicide such as W with Ti/TiN liner, a metal, a metal alloy, polysilicon, etc.

Separately or in combination, the filled grooves 136 may run through the source regions 128 between adjacent ones of the needle-shaped gate trenches 104 and extend to the body regions 130 to form body contact regions which provide an Ohmic or Schottky contact to the body regions 130.

Separately or in combination, the grooves 136 may be wider in a region where the grooves 136 intersect the field plates 108 and narrower between the needle-shaped field plate trenches 104. In FIG. 1, e.g., the grooves 136 have a width w1 in a region where the grooves 136 intersect the field plates 108 and a width w2 between the needle-shaped field plate trenches 104, where w1>w2.

Figure 4B:
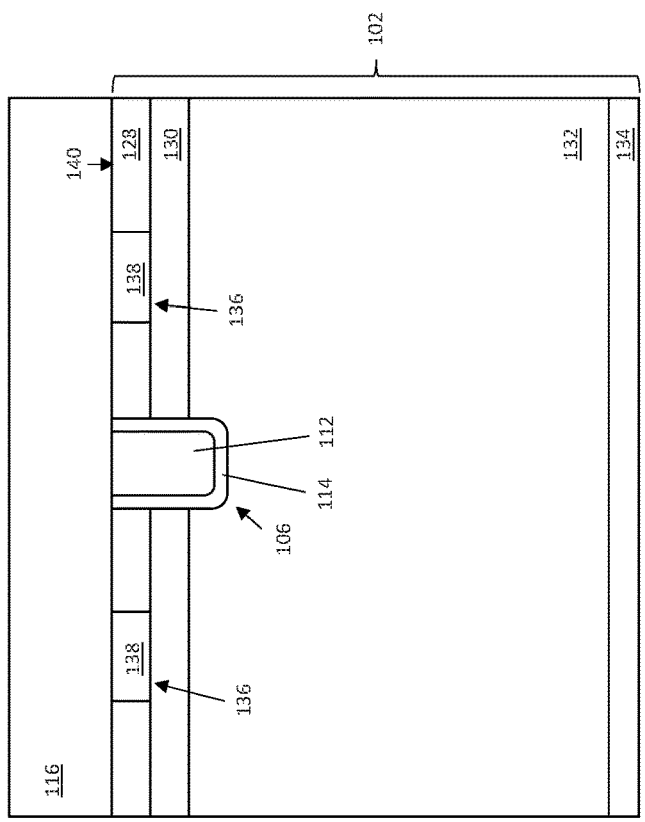
Figure 4A:
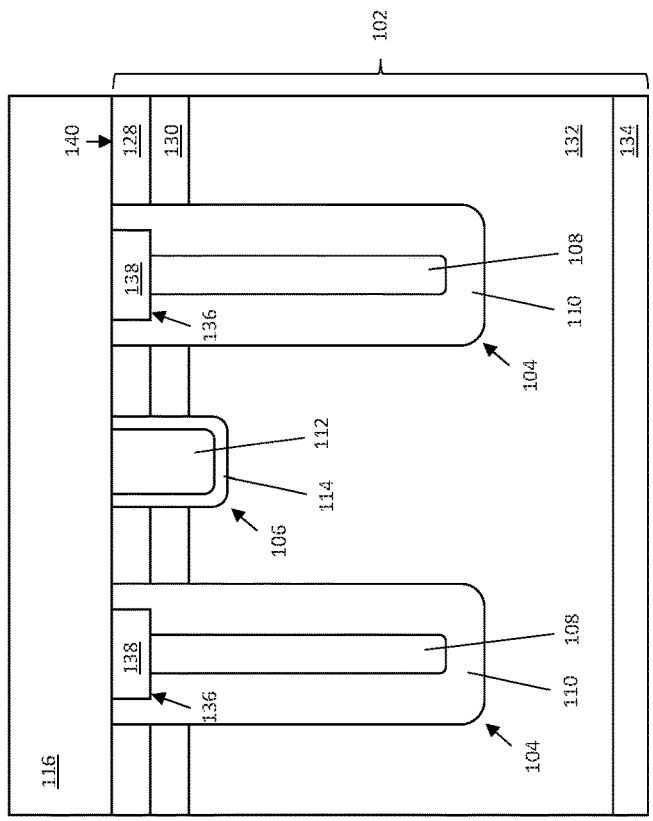
Figure 4C:
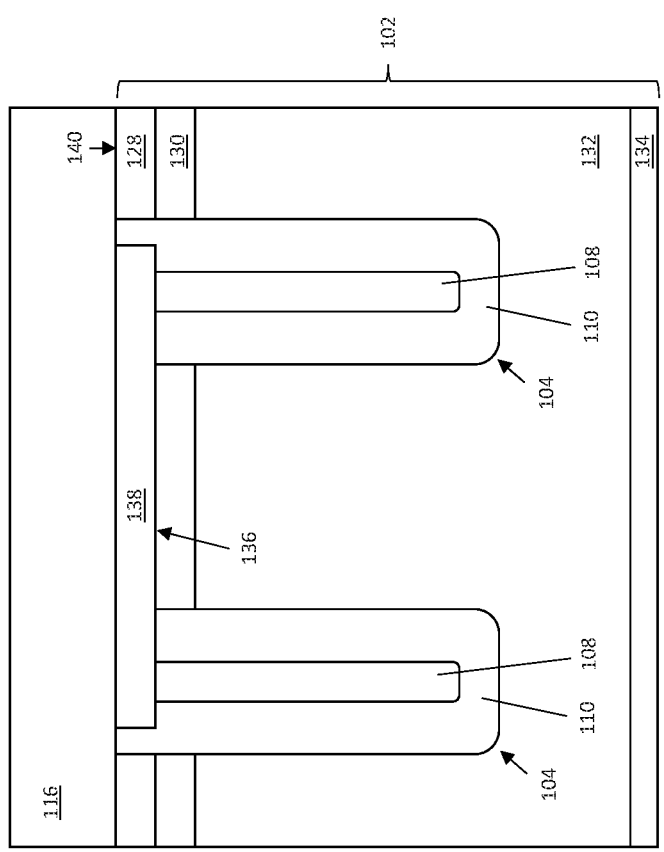

In FIGS. 4A through 4C, the first dielectric layer 116 is formed above the semiconductor substrate 102. In one embodiment, the first dielectric layer 116 is formed directly on the top (front) surface semiconductor substrate 102. The first dielectric layer 116 may be an ILD or similar type of electrical insulator.

Figure 5B:
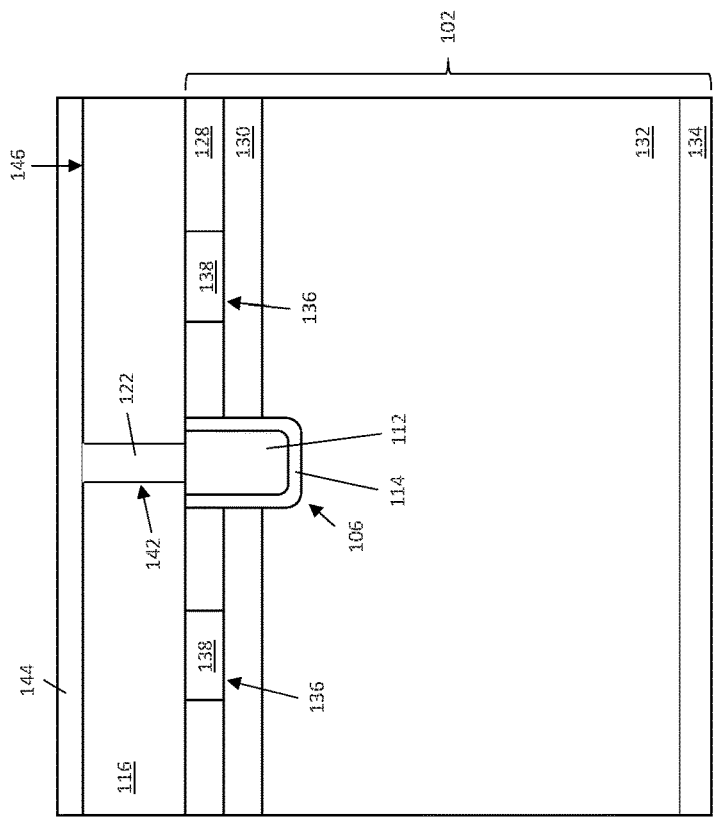
Figure 5A:
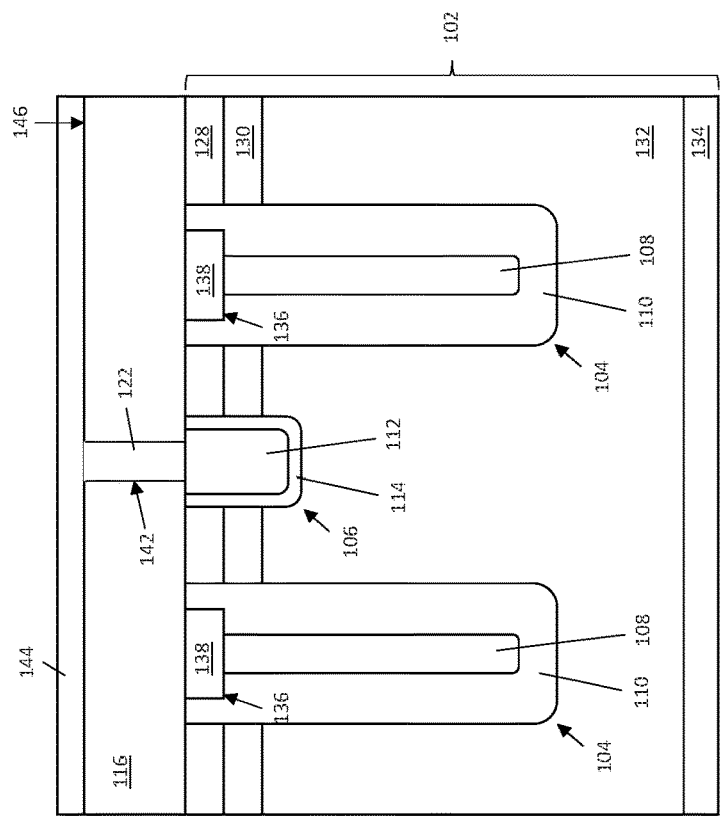
Figure 5C:
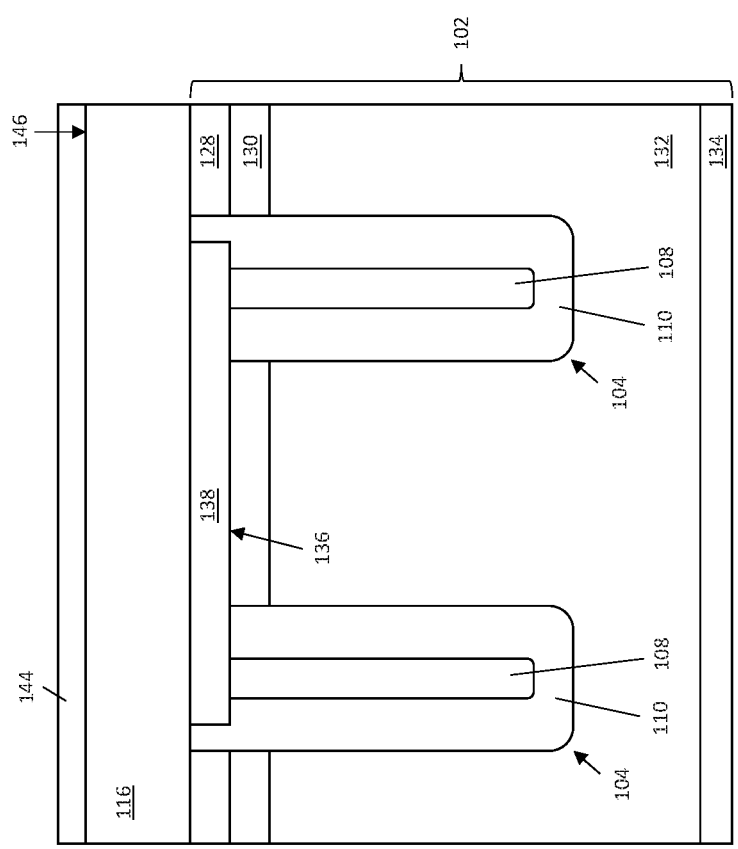

In FIGS. 5A through 5C, openings 142 are etched into the first dielectric layer 116. The openings 142 at least partly expose the gate electrodes 112 in the needle-shaped gate trenches 106. An electrically conductive material 144 is the deposited on the top surface 146 of the first dielectric layer 116. The electrically conductive material 144 fills the openings 142 in the first dielectric layer 116 to form the conductive vias 122 of the gate interconnect structure 118. In one embodiment, the electrically conductive material 144 deposited on the top surface 146 of the first dielectric layer 116 comprises W with a Ti/TiN liner. However, other forms of metal silicide may also be used to ensure the gate resistance is low for high speed switching. If gate resistance is not a critical parameter, polysilicon may be used for easier processing and integration.

Figures 6A, 6B:
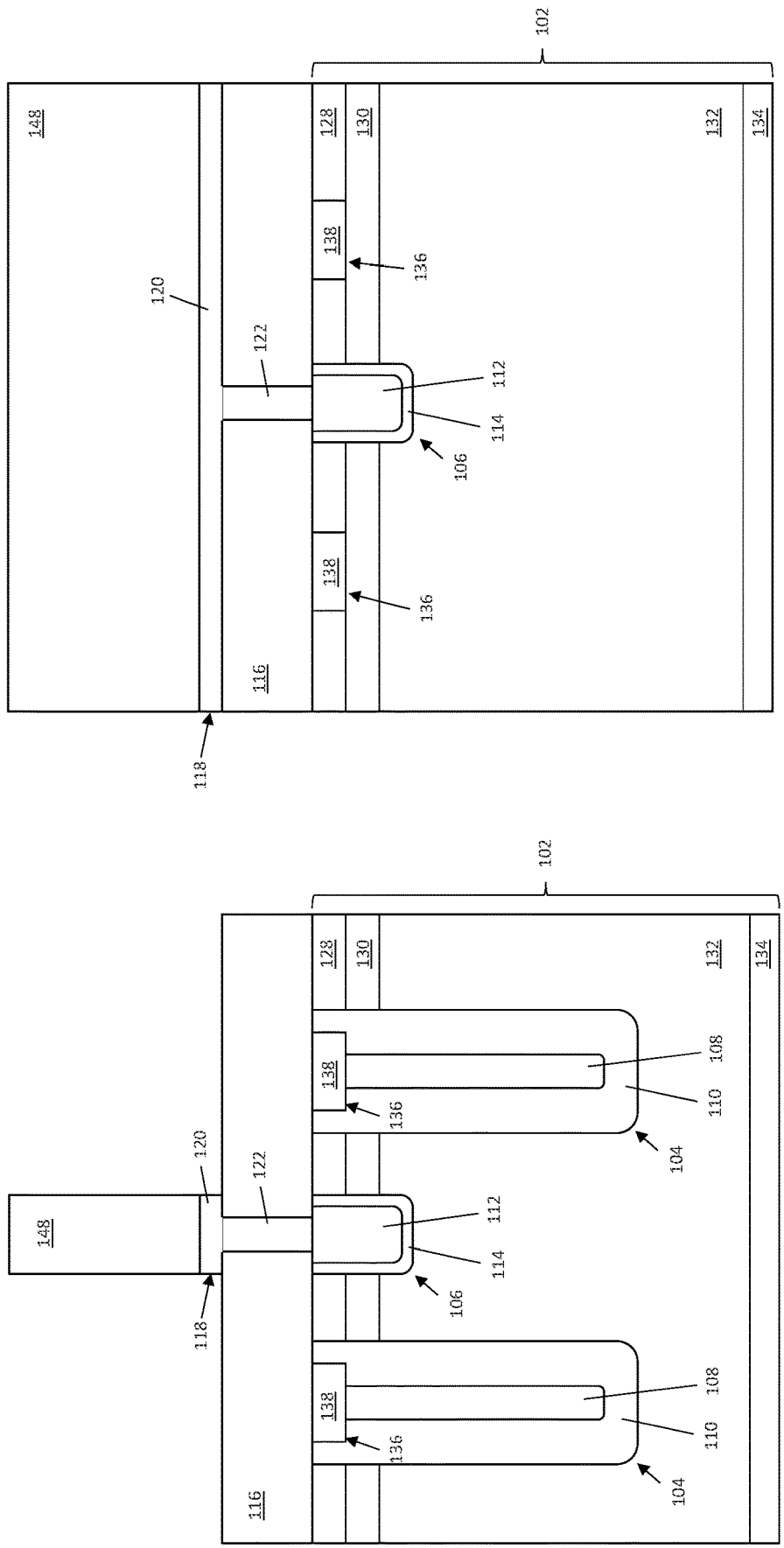
Figure 6C:
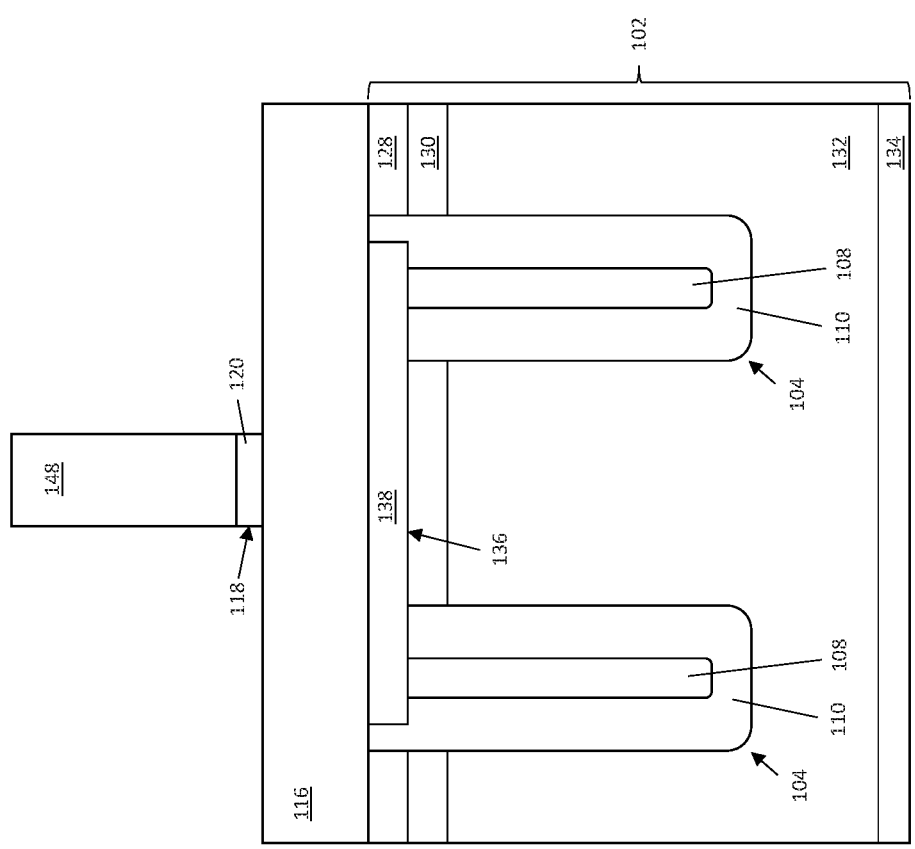

In FIGS. 6A through 6C, the electrically conductive material 144 deposited on the top surface 146 of the first dielectric layer 116 is etched to form the electrically conductive lines 120 of the gate interconnect structure 118. The gate interconnect structure 118 includes the electrically conductive lines 120 separated from the semiconductor substrate 102 by the first dielectric layer 116 and corresponding conductive vias 122 extending through the first dielectric layer 116 to connect the electrically conductive lines 120 to the gate electrodes 112 in the needle-shaped gate trenches 106. In one embodiment, the electrically conductive material 144 deposited on the top surface 146 of the first dielectric layer 116 is etched to form the electrically conductive lines 120 of the gate interconnect structure 118 using a lithographic etch process that includes developing a resist mask 148 and etching regions of the electrically conductive material 144 unprotected by the mask 148.

Figure 7A:
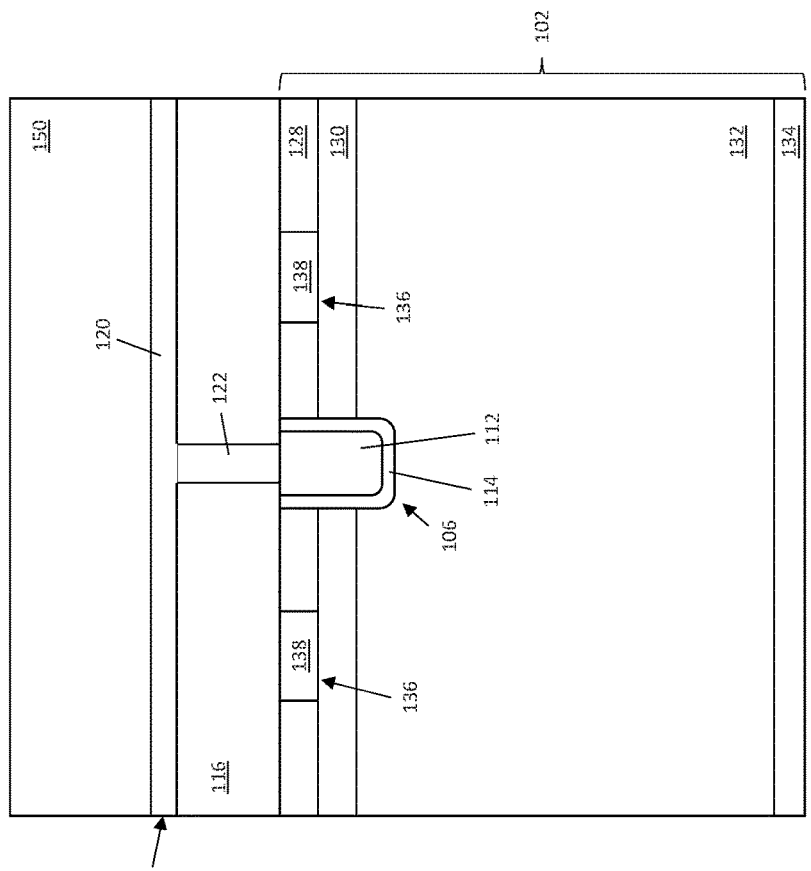
Figure 7B:
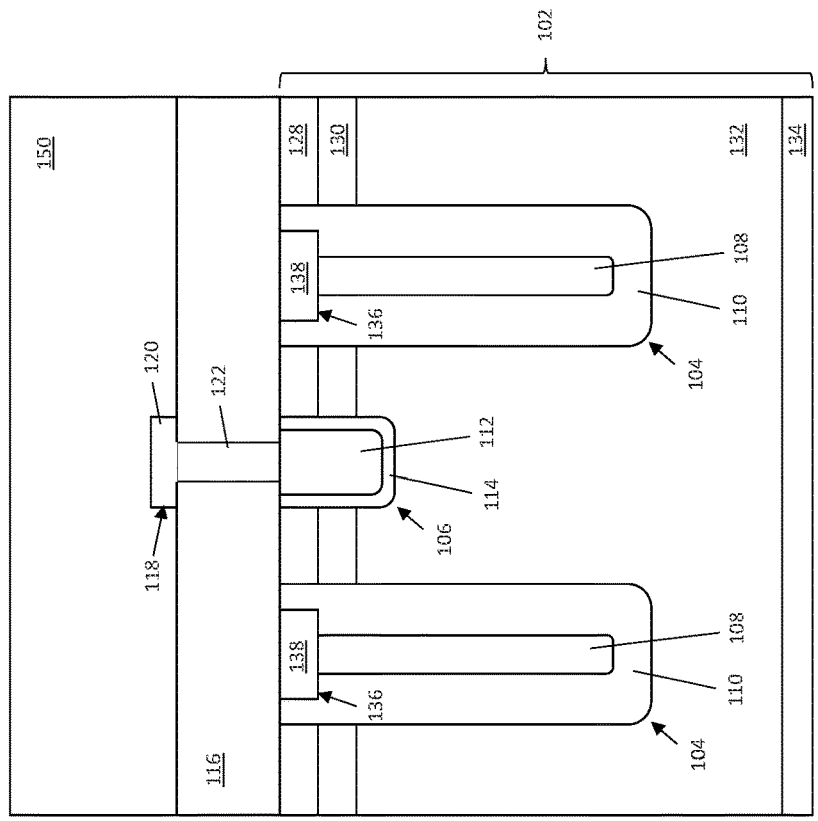
Figure 7C:
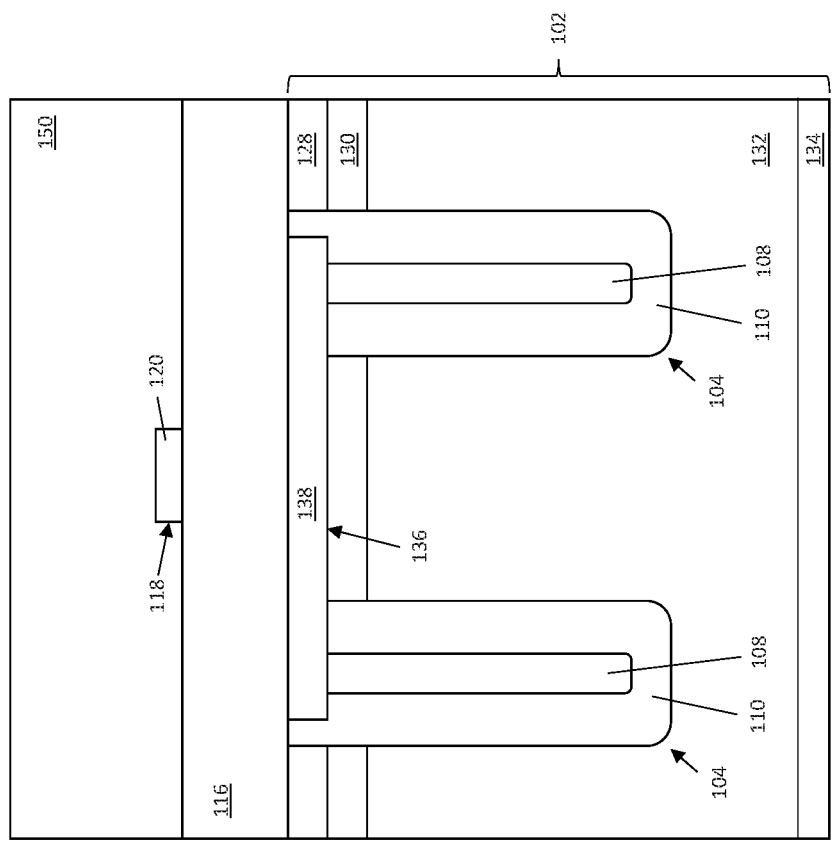

In FIGS. 7A through 7C, a second dielectric layer 150 is formed on the first dielectric layer 116. In one embodiment, the second dielectric layer 150 is an ILD or similar type of electrical insulator. The electrically conductive lines 120 of the gate interconnect structure 118 are sandwiched between the second dielectric layer 150 and the first dielectric layer 116, according to this embodiment.

Figure 8C:
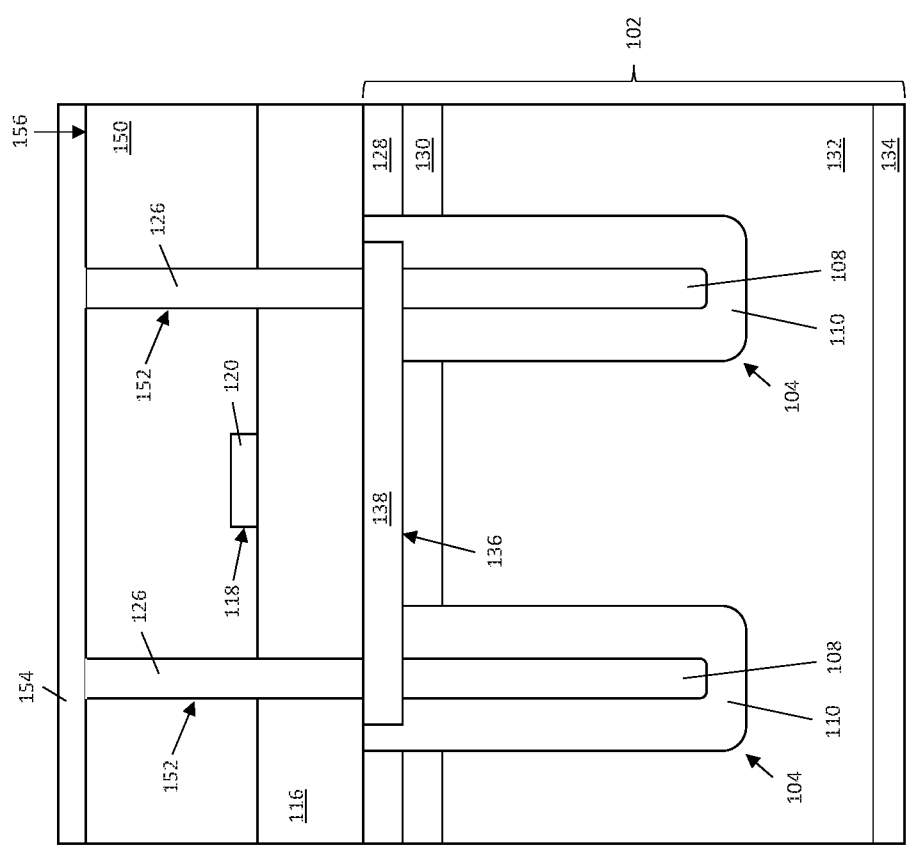

In FIGS. 8A through 8C, openings 152 are etched that extend through both the second dielectric layer 150 and the first dielectric layer 116. The openings 152 at least partly expose the field plates 108 in the needle-shaped field plate trenches 104. An electrically conductive material 154 is then deposited on the top surface 156 of the second dielectric layer 150. The electrically conductive material 154 fills the openings 152 to form the conductive vias 126 of the field plate interconnect structure 124. The conductive vias 126 of the field plate interconnect structure 124 extend through the second and first dielectric layers 150, 116 and connect to the field plates 108 in the needle-shaped field plate trenches 104. The electrically conductive material 154 on the top surface 156 of the second dielectric layer 150 may be etched or planarized to form a source metallization that provides source potential to the source regions 128, the body regions 130 and the field plates 108 of the device 100.

Figure 9:
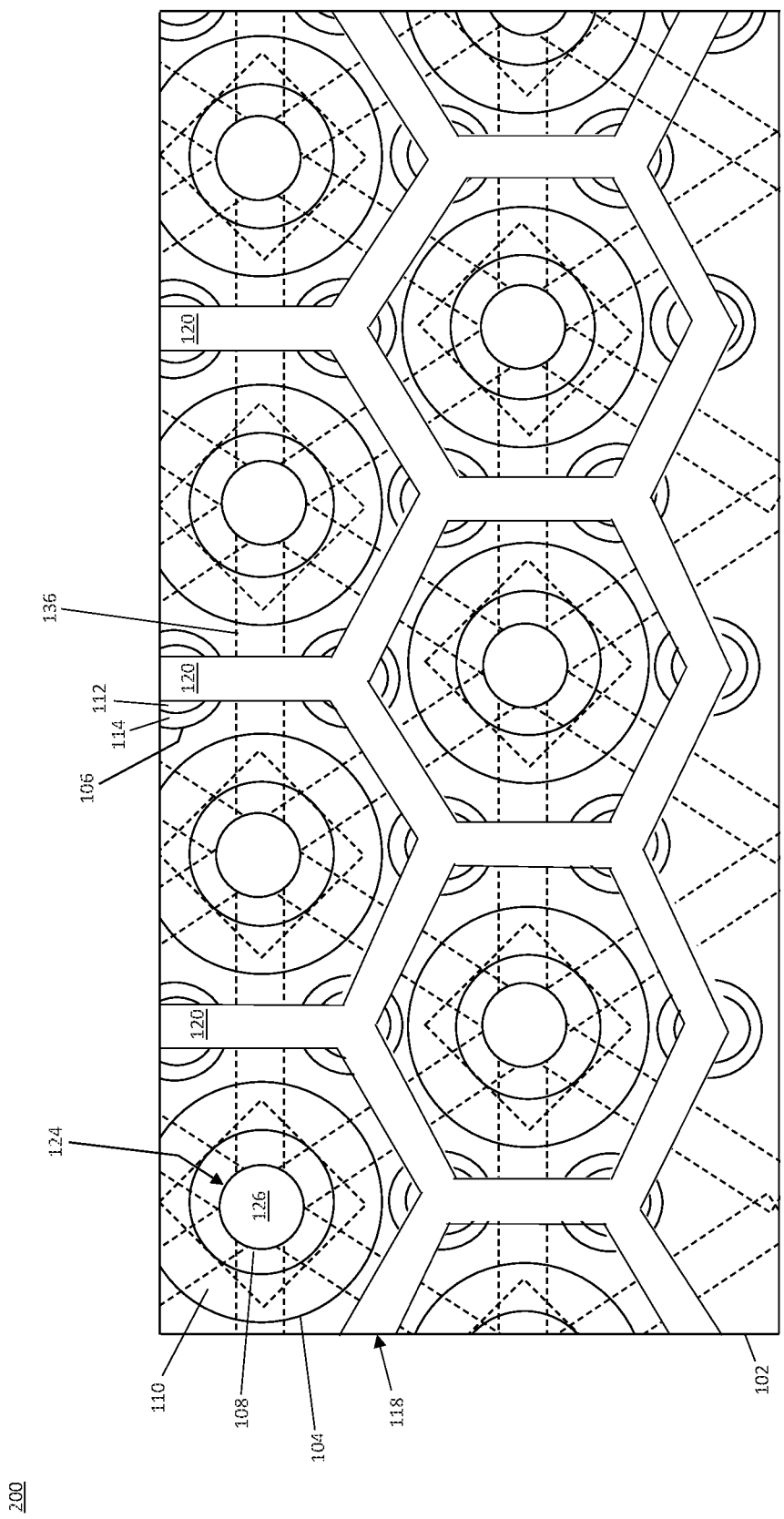
FIG. 9 illustrates a partial top plan view of another embodiment of a semiconductor transistor device having a needle gate trench configuration and a needle field plate trench configuration.

FIG. 9 illustrates a partial top plan view of another embodiment of a semiconductor transistor device 200 having a needle gate trench configuration and a needle field plate trench configuration. The embodiment shown in FIG. 9 is similar to the embodiment show in FIG. 1. Different, however, the needle-shaped field plate trenches 104 are arranged in a non-orthogonal array and the electrically conductive lines 120 of the gate interconnect structure 118 are connected in a honeycomb pattern. The method illustrated in FIGS. 2A through 8C may yield the semiconductor transistor device 100 shown in FIG. 1 or the semiconductor transistor device 200 shown in FIG. 9. For example, the needle-shaped field plate trenches 104 may be formed by etching the needle-shaped field plate trenches 104 into the semiconductor substrate 102 as an orthogonal array (FIG. 1) or by etching the needle-shaped field plate trenches 104 into the semiconductor substrate 102 as a non-orthogonal array (FIG. 9).

The device and method embodiments described herein may be used to produce discrete products such as discrete power MOSFETs, discrete IGBTs, discrete HEMTs, etc. The device and method embodiments described herein also may be used to produce integrated products such as the power stages or power block of a power converter. In each case, needle-shaped gate trenches are used instead of a stripe or grid gate trench layout, and gate runner and source/body contact networks are formed in a 3-dimensional space to yield feature size/pitch reductions, performance improvements and ease of manufacturing.

Although the present disclosure is not so limited, the following numbered examples demonstrate one or more aspects of the disclosure.

Example 1. A semiconductor device, comprising: a semiconductor substrate; a plurality of needle-shaped field plate trenches and a plurality of needle-shaped gate trenches formed in the semiconductor substrate and interspersed with one another; a first dielectric layer above the semiconductor substrate; a gate interconnect structure comprising electrically conductive lines separated from the semiconductor substrate by the first dielectric layer and first conductive vias extending through the first dielectric layer to connect the electrically conductive lines to gate electrodes in the needle-shaped gate trenches; and a field plate interconnect structure electrically isolated from the gate interconnect structure and comprising second conductive vias that extend through the first dielectric layer and connect to field plates in the needle-shaped field plate trenches.

Example 2. The semiconductor device of example 1, further comprising: a second dielectric layer on the first dielectric layer, wherein the electrically conductive lines of the gate interconnect structure are sandwiched between the second dielectric layer and the first dielectric layer, wherein the second conductive vias of the field plate interconnect structure extend through the second dielectric layer and the first dielectric layer to connect to the field plates in the needle-shaped field plate trenches.

Example 3. The semiconductor device of example 1, wherein the semiconductor substrate is a Si substrate.

Example 4. The semiconductor device of any of examples 1 through 3, further comprising: grooves formed in the semiconductor substrate and intersecting one another at the needle-shaped field plate trenches; and an electrically conductive material in the grooves and electrically connecting the field plates to one another.

Example 5. The semiconductor device of example 4, further comprising: body regions of a second conductivity type formed in the semiconductor substrate; source regions of a first conductivity type formed in the semiconductor substrate above the body regions; and a drift zone of the first conductivity type formed in the semiconductor substrate below the body regions such that the body regions separate the source regions from the drift zone, wherein the needle-shaped field plate trenches and the needle-shaped gate trenches extend through the source regions and the body regions and into the drift zone, wherein the grooves run through the source regions between adjacent ones of the needle-shaped gate trenches and extend to the body regions to form body contact regions.

Example 6. The semiconductor device of example 4 or 5, wherein the electrically conductive material in the grooves comprises a metal silicide.

Example 7. The semiconductor device of any of examples 4 through 6, wherein each of the needle-shaped field plate trenches is intersected by a plurality of the grooves.

Example 8. The semiconductor device of any of examples 4 through 7, wherein the grooves are wider in a region where the grooves intersect the field plates and narrower between the needle-shaped field plate trenches.

Example 9. The semiconductor device of any of examples 1 through 8, wherein the needle-shaped field plate trenches are arranged in an orthogonal array.

Example 10. The semiconductor device of any of examples 1 through 8, wherein the needle-shaped field plate trenches are arranged in a non-orthogonal array.

Example 11. The semiconductor device of any of examples 1 through 10, wherein the electrically conductive lines of the gate interconnect structure intersect one another at right angles.

Example 12. The semiconductor device of any of examples 1 through 10, wherein the electrically conductive lines of the gate interconnect structure are connected in a honeycomb pattern.

Example 13. A method of producing a semiconductor device, the method comprising: forming a plurality of needle-shaped field plate trenches and a plurality of needle-shaped gate trenches in a semiconductor substrate and interspersed with one another; forming a first dielectric layer above the semiconductor substrate; forming a gate interconnect structure comprising electrically conductive lines separated from the semiconductor substrate by the first dielectric layer and first conductive vias extending through the first dielectric layer to connect the electrically conductive lines to gate electrodes in the needle-shaped gate trenches; and forming a field plate interconnect structure electrically isolated from the gate interconnect structure and comprising second conductive vias that extend through the first dielectric layer and connect to field plates in the needle-shaped field plate trenches.

Example 14. The method of example 13, further comprising: forming a second dielectric layer on the first dielectric layer, wherein the electrically conductive lines of the gate interconnect structure are sandwiched between the second dielectric layer and the first dielectric layer, wherein the second conductive vias of the field plate interconnect structure extend through both the second dielectric layer and the first dielectric layer to connect to the field plates in the needle-shaped field plate trenches.

Example 15. The method of example 14, wherein forming the field plate interconnect structure comprises: etching openings that extend through both the second dielectric layer and the first dielectric layer, the openings at least partly exposing the field plates in the needle-shaped field plate trenches; depositing an electrically conductive material on a surface of the second dielectric layer, the electrically conductive material filling the openings to form the second conductive vias; and removing the electrically conductive material from the surface of the second dielectric layer.

Example 16. The method of any of examples 13 through 15, further comprising: forming grooves in the semiconductor substrate that intersect one another at the needle-shaped field plate trenches; and filling the grooves with an electrically conductive material that electrically connects the field plates to one another.

Example 17. The method of example 16, further comprising: forming body regions of a second conductivity type in the semiconductor substrate; and forming source regions of a first conductivity type in the semiconductor substrate above the body regions, the body regions separating the source regions from an underlying drift zone of the first conductivity type, wherein the needle-shaped field plate trenches and the needle-shaped gate trenches extend through the source regions and the body regions and into the drift zone, wherein the grooves run through the source regions between adjacent ones of the needle-shaped gate trenches and extend to the body regions to form body contact regions.

Example 18. The method of example 16 or 17, wherein forming the grooves comprises etching the grooves into the semiconductor substrate such that each of the needle-shaped field plate trenches is intersected by a plurality of the grooves.

Example 19. The method of any of examples 13 through 18, wherein forming the gate interconnect structure comprises: etching openings in the first dielectric layer, the openings at least partly exposing the gate electrodes in the needle-shaped gate trenches; depositing an electrically conductive material on a surface of the first dielectric layer, the electrically conductive material filling the openings in the first dielectric layer to form the first conductive vias; and etching the electrically conductive material deposited on the surface of the first dielectric layer to form the electrically conductive lines.

Example 20. The method of any of examples 13 through 19, wherein forming the plurality of needle-shaped field plate trenches comprises: etching the needle-shaped field plate trenches into the semiconductor substrate as an orthogonal array; or etching the needle-shaped field plate trenches into the semiconductor substrate as a non-orthogonal array.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor substrate;
    a plurality of needle-shaped field plate trenches and a plurality of needle-shaped gate trenches formed in the semiconductor substrate and interspersed with one another;
    a first dielectric layer above the semiconductor substrate;
    a gate interconnect structure comprising electrically conductive lines separated from the semiconductor substrate by the first dielectric layer and first conductive vias extending through the first dielectric layer to connect the electrically conductive lines to gate electrodes in the needle-shaped gate trenches; and
    a field plate interconnect structure electrically isolated from the gate interconnect structure and comprising second conductive vias that extend through the first dielectric layer and connect to field plates in the needle-shaped field plate trenches.

2. The semiconductor device of claim 1, further comprising:
    a second dielectric layer on the first dielectric layer,
    wherein the electrically conductive lines of the gate interconnect structure are sandwiched between the second dielectric layer and the first dielectric layer,
    wherein the second conductive vias of the field plate interconnect structure extend through the second dielectric layer and the first dielectric layer to connect to the field plates in the needle-shaped field plate trenches.

3. The semiconductor device of claim 1, wherein the semiconductor substrate is a Si substrate.

4. The semiconductor device of claim 1, further comprising:
    grooves formed in the semiconductor substrate and intersecting one another at the needle-shaped field plate trenches; and
    an electrically conductive material in the grooves and electrically connecting the field plates to one another.

5. The semiconductor device of claim 4, further comprising:
    body regions of a second conductivity type formed in the semiconductor substrate;
    source regions of a first conductivity type formed in the semiconductor substrate above the body regions; and
    a drift zone of the first conductivity type formed in the semiconductor substrate below the body regions such that the body regions separate the source regions from the drift zone,
    wherein the needle-shaped field plate trenches and the needle-shaped gate trenches extend through the source regions and the body regions and into the drift zone,
    wherein the grooves run through the source regions between adjacent ones of the needle-shaped gate trenches and extend to the body regions to form body contact regions.

6. The semiconductor device of claim 4, wherein the electrically conductive material in the grooves comprises a metal silicide.

7. The semiconductor device of claim 4, wherein each of the needle-shaped field plate trenches is intersected by a plurality of the grooves.

8. The semiconductor device of claim 4, wherein the grooves are wider in a region where the grooves intersect the field plates and narrower between the needle-shaped field plate trenches.

9. The semiconductor device of claim 1, wherein the needle-shaped field plate trenches are arranged in an orthogonal array.

10. The semiconductor device of claim 1, wherein the needle-shaped field plate trenches are arranged in a non-orthogonal array.

11. The semiconductor device of claim 1, wherein the electrically conductive lines of the gate interconnect structure intersect one another at right angles.

12. The semiconductor device of claim 1, wherein the electrically conductive lines of the gate interconnect structure are connected in a honeycomb pattern.

13. A method of producing a semiconductor device, the method comprising:
    forming a plurality of needle-shaped field plate trenches and a plurality of needle-shaped gate trenches in a semiconductor substrate and interspersed with one another;
    forming a first dielectric layer above the semiconductor substrate;
    forming a gate interconnect structure comprising electrically conductive lines separated from the semiconductor substrate by the first dielectric layer and first conductive vias extending through the first dielectric layer to connect the electrically conductive lines to gate electrodes in the needle-shaped gate trenches; and
    forming a field plate interconnect structure electrically isolated from the gate interconnect structure and comprising second conductive vias that extend through the first dielectric layer and connect to field plates in the needle-shaped field plate trenches.

14. The method of claim 13, further comprising:
forming a second dielectric layer on the first dielectric layer,
wherein the electrically conductive lines of the gate interconnect structure are sandwiched between the second dielectric layer and the first dielectric layer,
wherein the second conductive vias of the field plate interconnect structure extend through both the second dielectric layer and the first dielectric layer to connect to the field plates in the needle-shaped field plate trenches.

15. The method of claim 14, wherein forming the field plate interconnect structure comprises:
etching openings that extend through both the second dielectric layer and the first dielectric layer, the openings at least partly exposing the field plates in the needle-shaped field plate trenches;
depositing an electrically conductive material on a surface of the second dielectric layer, the electrically conductive material filling the openings to form the second conductive vias; and
removing the electrically conductive material from the surface of the second dielectric layer.

16. The method of claim 13, further comprising:
forming grooves in the semiconductor substrate that intersect one another at the needle-shaped field plate trenches; and
filling the grooves with an electrically conductive material that electrically connects the field plates to one another.

17. The method of claim 16, further comprising:
forming body regions of a second conductivity type in the semiconductor substrate; and
forming source regions of a first conductivity type in the semiconductor substrate above the body regions, the body regions separating the source regions from an underlying drift zone of the first conductivity type,
wherein the needle-shaped field plate trenches and the needle-shaped gate trenches extend through the source regions and the body regions and into the drift zone,
wherein the grooves run through the source regions between adjacent ones of the needle-shaped gate trenches and extend to the body regions to form body contact regions.

18. The method of claim 16, wherein forming the grooves comprises etching the grooves into the semiconductor substrate such that each of the needle-shaped field plate trenches is intersected by a plurality of the grooves.

19. The method of claim 13, wherein forming the gate interconnect structure comprises:
etching openings in the first dielectric layer, the openings at least partly exposing the gate electrodes in the needle-shaped gate trenches;
depositing an electrically conductive material on a surface of the first dielectric layer, the electrically conductive material filling the openings in the first dielectric layer to form the first conductive vias; and
etching the electrically conductive material deposited on the surface of the first dielectric layer to form the electrically conductive lines.

20. The method of claim 13, wherein forming the plurality of needle-shaped field plate trenches comprises:
etching the needle-shaped field plate trenches into the semiconductor substrate as an orthogonal array; or
etching the needle-shaped field plate trenches into the semiconductor substrate as a non-orthogonal array.

* * * * *